(12) United States Patent
Suzuki et al.

(10) Patent No.: US 9,236,468 B2
(45) Date of Patent: Jan. 12, 2016

(54) SEMICONDUCTOR TRANSISTOR DEVICE AND METHOD FOR MANUFACTURING SAME

(71) Applicant: KABUSHIKI KAISHA TOSHIBA, Tokyo (JP)

(72) Inventors: Miwako Suzuki, Kanagawa (JP); Norio Yasuhara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/141,279

(22) Filed: Dec. 26, 2013

(65) Prior Publication Data

US 2014/0103427 A1     Apr. 17, 2014

Related U.S. Application Data

(62) Division of application No. 13/239,248, filed on Sep. 21, 2011, now Pat. No. 8,643,095.

(30) Foreign Application Priority Data

Mar. 25, 2011   (JP) .................................. 2011-068275

(51) Int. Cl.
*H01L 29/08*   (2006.01)
*H01L 29/78*   (2006.01)
(Continued)

(52) U.S. Cl.
CPC ........ *H01L 29/7813* (2013.01); *H01L 29/0878* (2013.01); *H01L 29/1095* (2013.01); *H01L 29/407* (2013.01); *H01L 29/66734* (2013.01); *H01L 29/0634* (2013.01)

(58) Field of Classification Search
CPC . H01L 29/1095; H01L 29/7813; H01L 29/76; H01L 29/0878; H01L 29/407; H01L 29/0634
USPC .................................... 257/330, E29.066, 328
See application file for complete search history.

(56) References Cited

U.S. PATENT DOCUMENTS 5,674,766 A    10/1997  Darwish et al.
5,998,833 A *  12/1999  Baliga ........................... 257/329
(Continued)

FOREIGN PATENT DOCUMENTS

CN    101180737 A    5/2008
CN    102097323      6/2011
(Continued)

OTHER PUBLICATIONS

Japanese Office Action dated Aug. 14, 2013, filed in Japanese counterpart Application No. 2011-068275.
(Continued)

*Primary Examiner* — Mamadou Diallo
*Assistant Examiner* — Christina Sylvia
(74) *Attorney, Agent, or Firm* — Patterson & Sheridan, LLP

(57) ABSTRACT

According to one embodiment, a semiconductor device includes a drift layer. The device includes a base layer. The device includes a source layer selectively provided on a surface of the base layer. The device includes a gate electrode provided via a gate insulating film in a trench penetrating the source layer and the base layer to reach the drift layer. The device includes a field plate electrode provided under the gate electrode in the trench. The device includes a drain electrode electrically connected to the drift layer. The device includes a source electrode. The field plate electrode is electrically connected to the source electrode. An impurity concentration of a first conductivity type contained in the base layer is lower than an impurity concentration of the first conductivity type contained in the drift layer. And the impurity concentration of the first conductivity type contained in the drift layer is not less than $1 \times 10^{16}$ (atoms/cm$^3$).

6 Claims, 7 Drawing Sheets

(51) Int. Cl.
 *H01L 29/10* (2006.01)
 *H01L 29/40* (2006.01)
 *H01L 29/66* (2006.01)
 *H01L 29/06* (2006.01)

(56) References Cited

U.S. PATENT DOCUMENTS

| | | | |
|---|---|---|---|
| 6,285,060 B1 * | 9/2001 | Korec et al. | 257/342 |
| 6,388,286 B1 | 5/2002 | Baliga | |
| 6,545,316 B1 | 4/2003 | Baliga | |
| 2001/0028084 A1 | 10/2001 | Mo | |
| 2002/0030237 A1 | 3/2002 | Omura et al. | |
| 2003/0006454 A1 | 1/2003 | Darwish | |
| 2003/0008460 A1 | 1/2003 | Darwish | |
| 2005/0173758 A1 | 8/2005 | Peake et al. | |
| 2006/0054970 A1 * | 3/2006 | Yanagida et al. | 257/330 |
| 2006/0214222 A1 | 9/2006 | Challa et al. | |
| 2008/0298291 A1 | 12/2008 | Miura et al. | |
| 2011/0136310 A1 | 6/2011 | Grivna | |

FOREIGN PATENT DOCUMENTS

| | | |
|---|---|---|
| JP | H08-250731 A | 9/1996 |
| JP | 2002-083963 A | 3/2002 |
| JP | 2002528916 A | 9/2002 |
| JP | 2007103902 A | 4/2007 |
| JP | 2009253139 A | 10/2009 |
| WO | 2002-01644 A2 | 1/2002 |
| WO | 2005065385 A2 | 7/2005 |

OTHER PUBLICATIONS

Japanese Office Action dated May 2, 2014, filed in Japanese counterpart Application No. 2011-068275, 6 pages (with translation).
Chinese Office Action dated Mar. 4, 2014, filed in Chinese counterpart Application No. 201110251512.1, 12 pages (with translation).
Japanese Office Action dated Jan. 29, 2015, filed in Japanese counterpart Application No. 2011-068275, 4 pages (with translation).
Chinese Office Action dated Nov. 15, 2014, filed in Chinese counterpart Application No. 201110251512.1, 7 pages (with translation).
Chinese Office Action dated May 5, 2015, filed in Chinese counterpart Application No. 201110251512.1, 14 pages (with translation).

* cited by examiner

SEMICONDUCTOR TRANSISTOR DEVICE AND METHOD FOR MANUFACTURING SAME

CROSS-REFERENCE TO RELATED APPLICATIONS

This application is a divisional of U.S. patent application Ser. No. 13/239,248, filed Sep. 21, 2011, which is based upon and claims the benefit of priority from the prior Japanese Patent Application No. 2011-068275, filed on Mar. 25, 2011; the entire contents of which are incorporated herein by reference.

FIELD

Embodiments described herein relate generally to a semiconductor devise and a method for manufacturing the same.

BACKGROUND

Since a rate of a channel resistance in an on-resistance has been high in a MOSFET (Metal Oxide Semiconductor Field Effect Transistor) with a trench type gate structure, a channel density has been increased by miniaturization etc. to thereby achieve reduction of the on-resistance. When reducing the on-resistance is achieved to some extent by increasing the channel density, next, reducing a resistance of a drift layer has been required.

MOSFET structures to achieve reduction of the resistance of the drift layer include a field plate structure (hereinafter also represented as an FP structure), a super junction structure (hereinafter also represented as an SJ structure), etc. Since a depletion layer formed in the drift layer can be extended more widely using any structure, an impurity concentration in the drift layer can be made high, and further, a high breakdown voltage can be obtained. In addition, when this kind of MOSFET is an n-channel type element, generally, an n-type impurity is contained in the drift layer, and a p-type impurity is contained in a base layer in which a channel is formed.

However, when an n-type impurity concentration contained in the drift layer becomes not less than a certain concentration, a mobility of the drift layer may decrease rapidly. Additionally, in this kind of MOSFET, the p-type impurity larger in amount than the n-type impurity is injected on a surface of the drift layer, and the base layer different from the drift layer in a conductivity type is formed on the surface of the drift layer. Hence, in the base layer, originally contained is substantially the same amount of n-type impurity as the amount of n-type impurity contained in the drift layer. Accordingly, in an example of the n-channel type MOSFET, there is a possibility that an n-type impurity concentration contained in the base layer affects a resistance of the channel formed in the base layer.

DETAILED DESCRIPTION

Figure 1A:
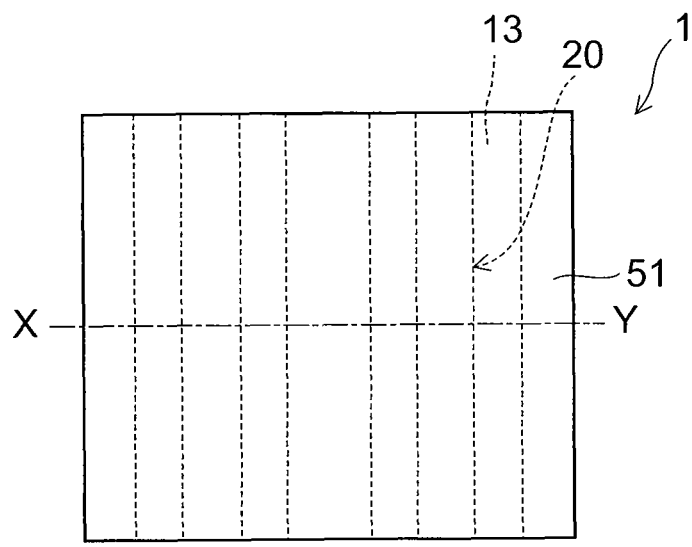
FIGS. 1A and 1B are schematic views of a semiconductor device according to the first embodiment.

In general, according to one embodiment, a semiconductor device can include a drift layer of a first conductivity type. The device can include a base layer of a second conductivity type provided on the drift layer. The device can include a source layer of a first conductivity type selectively provided on a surface of the base layer. The device can include a gate electrode provided via a gate insulating film in a trench penetrating the source layer and the base layer to reach the drift layer. The device can include a field plate electrode provided under the gate electrode in the trench. The field plate electrode is provided via a field plate insulating film in the trench. The device can include a drain electrode electrically connected to the drift layer. The device can include a source electrode electrically connected to the source layer. The field plate electrode is electrically connected to the source electrode. An impurity concentration of the first conductivity type contained in the base layer is lower than an impurity concentration of the first conductivity type contained in the drift layer. And the impurity concentration of the first conductivity type contained in the drift layer is not less than $1 \times 10^{16}$ (atoms/cm$^3$).

Embodiments will now be described with reference to the drawings. In the following description, like reference numerals are marked with like members, and a description of the members having been described once is omitted as appropriate.

First Embodiment

Figure 1B:
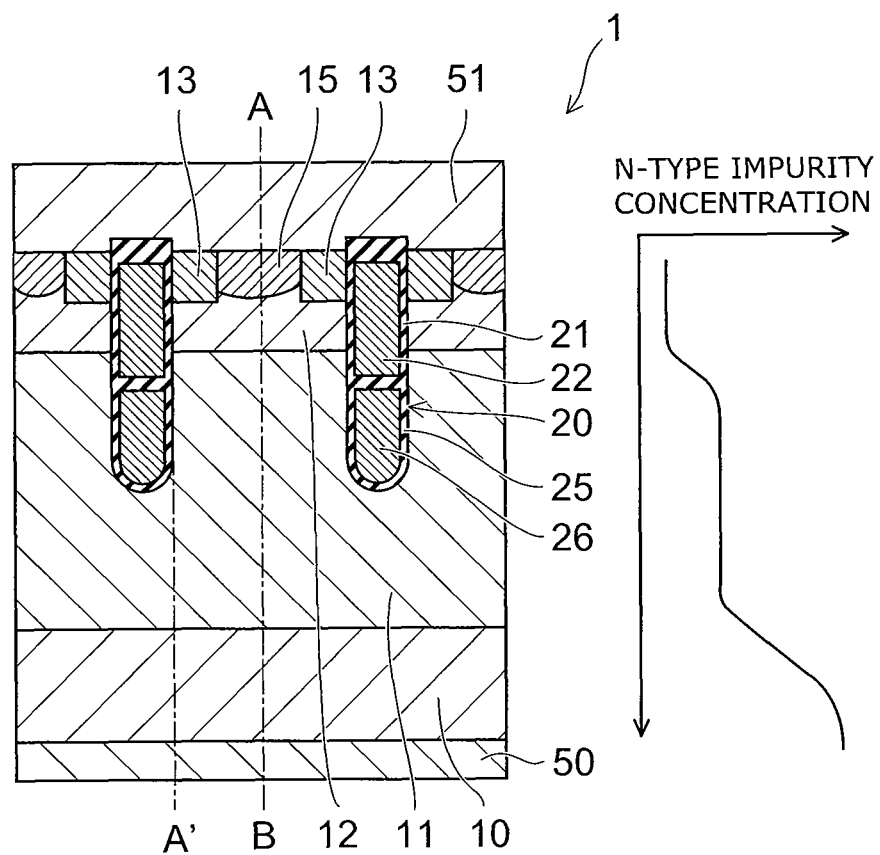

FIGS. 1A and 1B are schematic views of a semiconductor device according to the first embodiment, and FIG. 1A is a plan schematic view, and FIG. 1B shows a cross-sectional schematic view in an X-Y position of FIG. 1A, and an impurity concentration profile.

The impurity concentration profile shown on a right side of the cross-sectional schematic view of the semiconductor device shows n-type impurity concentrations in a base layer, a drift layer, and a drain layer along an A-B line of the cross-sectional schematic view.

A semiconductor device 1 according to the first embodiment is a MOSFET with a trench gate type structure. As the MOSFET, an n-channel type MOSFET is illustrated as one example.

The semiconductor device 1 has an n$^+$-type drain layer 10, and an n-type drift layer 11 is provided on the drain layer 10. A p-type base layer 12 is provided on the drift layer 11. An n$^+$-type source layer 13 is selectively provided on a surface of the base layer 12. A p-type contact layer 15 is selectively provided on the surface of the base layer 12 so as to be adjacent to the source layer 13. A p-type impurity concentration contained in the contact layer 15 is higher than a value obtained by subtracting an n-type impurity concentration from a p-type impurity concentration contained in the base layer 12. The contact layer 15, for example, functions as a hole extraction layer for maintaining high avalanche resistance.

In the semiconductor device 1, a gate electrode 22 is provided via a gate insulating film 21 in a trench 20 that penetrates the source layer 13 and the base layer 12 to reach the drift layer 11. In the trench 20, a field plate electrode (buried electrode) 26 is further provided via a field plate insulating film 25. The field plate electrode 26 is located under the gate electrode 22.

The trench 20 and the source layer 13 are arranged in a striped manner when viewed from a direction perpendicular to a major surface of the drain layer 10. A pitch of the trenches 20 in a direction substantially perpendicular to a direction where the trenches 20 extend in the striped manner (a direction where the plurality of trenches 20 are periodically arranged) is, for example, not more than 1.5 µm. That is, an another field plate electrode 26 is provided in another trench 20 which penetrates the source layer 13 and the base layer 12 to reach the drift layer 11, and the pitch between the field plate electrode 26 and the another field plate electrode 26 in a direction substantially perpendicular to a direction where the field plate electrode 26 extends in the striped manner is not more than 1.5 µm.

In the semiconductor device 1, a drain electrode 50 is connected to the drain layer 10. As a result of this, the drain electrode 50 is electrically connected to the drift layer 11. A source electrode 51 is electrically connected to the source layer 13 and the contact layer 15. The field plate electrode 26 is electrically connected to the source electrode 51.

The n-type impurity concentration contained in the base layer 12 is lower than an n-type impurity concentration contained in the drift layer 11. The n-type impurity concentration contained in the drift layer 11 is not less than $1\times10^{16}$ (atoms/cm$^3$). In the embodiment, the n$^+$ type and the n type may be used as a first conductivity type, and the p-type as a second conductivity type. There are included arsenic (As), phosphorus (P), etc. as impurities of the first conductivity type. In the embodiment, arsenic (As) with a lower diffusion coefficient in a high-temperature state is preferentially used. There are included boron (B), etc as impurities of the second conductivity type.

A main constituent of the drain layer 10, the drift layer 11, the base layer 12, and the source layer 13 is, for example, silicon (Si). A main constituent of the gate electrode 22 and the field plate electrode 26 is, for example, polysilicon (poly-Si). A material of the gate insulating film 21 and the field plate insulating film 25 is, for example, silicon oxide (SiO$_2$).

In the semiconductor device 1, a capacity between the gate and the drain is reduced since the field plate electrode 26 is provided under the gate electrode 22. In addition, since an electric field easily concentrates also on a bottom of the trench 20, electric field concentration on an interface between the base layer 12 and the drift layer 11 is mitigated. Further, since the field plate electrode 26 is provided, a depletion layer formed in the drift layer 11 easily extends. As a result of this, the semiconductor device 1 has a high breakdown voltage. In the semiconductor device 1, even if the n-type impurity concentration contained in the drift layer 11 is set to be not less than $1.0\times10^{16}$ (atoms/cm$^3$), it is possible to deplete the whole drift layer 11.

As described above, in the semiconductor device 1, the field plate electrode 26 is provided, and the n-type impurity concentration contained in the drift layer 11 is set to be high. Thereby, the semiconductor device 1 holds the high breakdown voltage. Further, the semiconductor device 1 has the drift layer 11 with a low resistance.

A method for manufacturing the semiconductor device 1 will be described. FIGS. 2A to 4B are cross-sectional schematic views for explaining a method for manufacturing a semiconductor device.

Figure 2A:
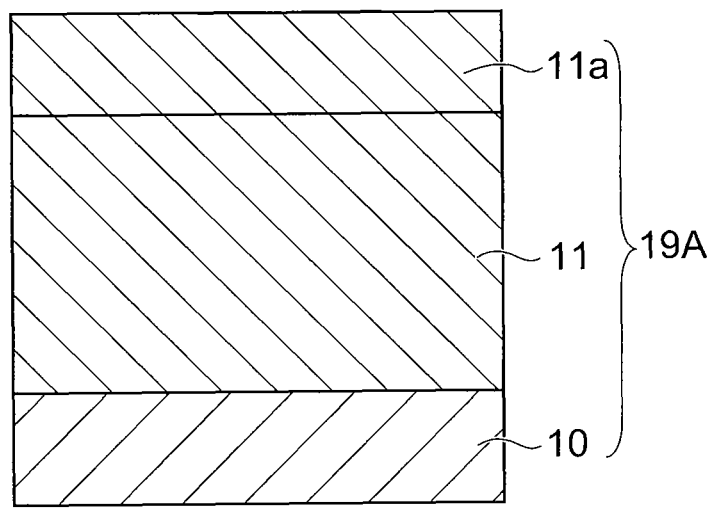
FIGS. 2A to 4B are cross-sectional schematic views for explaining a method for manufacturing a semiconductor device.

First, as shown in FIG. 2A, a semiconductor stacked body 19A including the drain layer 10, the drift layer 11, and a low-concentration drift layer 11a is prepared. The drift layer 11 is provided on the drain layer 10, and the low-concentration drift layer 11a is provided on the drift layer 11. An n-type impurity concentration contained in the drift layer 11a is lower than the n-type impurity concentration contained in the drift layer 11. The n-type impurity concentration contained in the drift layer 11 is not less than $1\times10^{16}$ (atoms/cm$^3$).

In the semiconductor stacked body 19A, the drain layer 10, the drift layer 11, and the drift layer 11a are formed by epitaxial growth.

Figure 2B:
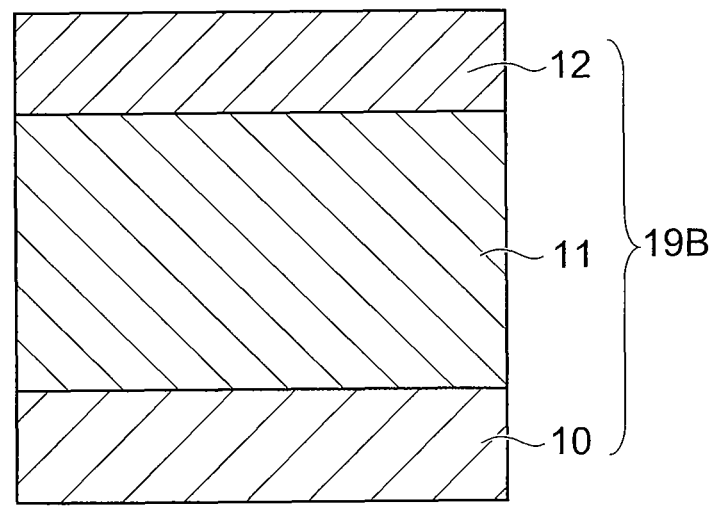

Next, as shown in FIG. 2B, a p-type impurity is ion-injected in the drift layer 11a. As a result of this, a semiconductor stacked body 19B including the drain layer 10, the drift layer 11 provided on the drain layer 10, and the base layer 12 provided on the drift layer 11 is prepared.

In the semiconductor stacked body 19B, since the n-type impurity concentration contained in the drift layer 11a is lower than the n-type impurity concentration contained in the drift layer 11, the n-type impurity concentration contained in the base layer 12 is lower than the n-type impurity concentration contained in the drift layer 11.

Figure 2C:
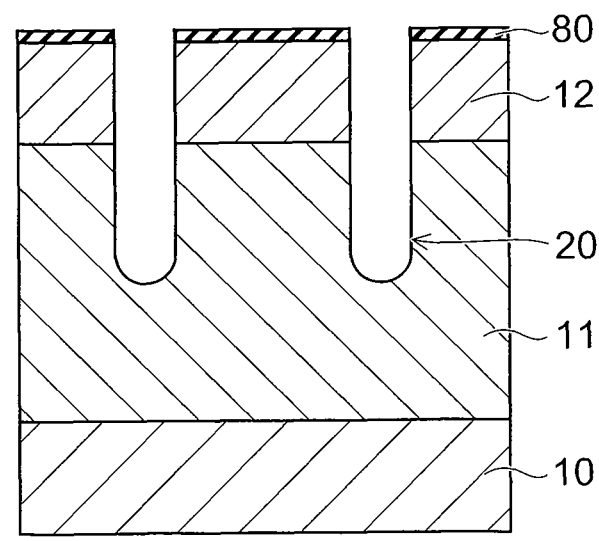

Next, as shown in FIG. 2C, a mask member 80 is selectively formed on the surface of the base layer 12, and etching process is performed on the semiconductor stacked body 19B opened through the mask member 80. The etching is RIE (Reactive Ion Etching). Thereby, the trench 20 that penetrates the base layer 12 to reach the drift layer 11 is formed.

Figure 3A:
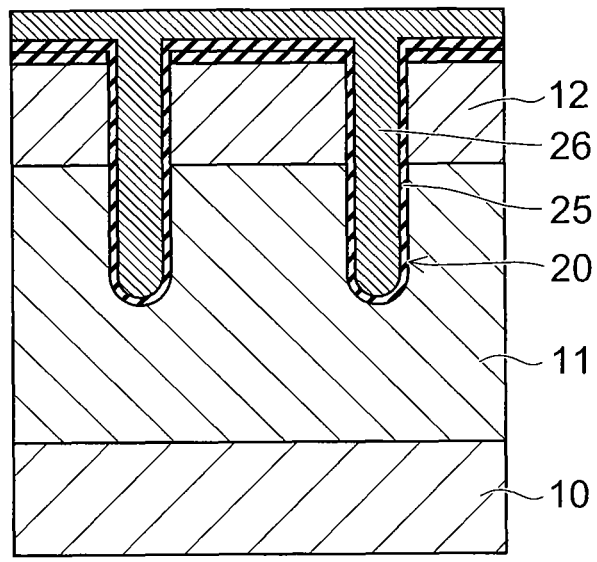

Next, as shown in FIG. 3A, the field plate insulating film 25 is formed in the trench 20 by thermal oxidation. Subsequently, the field plate electrode 26 is formed in the trench 20 by CVD (Chemical Vapor Deposition) via the field plate insulating film 25. The field plate electrode 26 is buried in the trench 20, and it is formed also on the base layer 12.

Figure 3B:
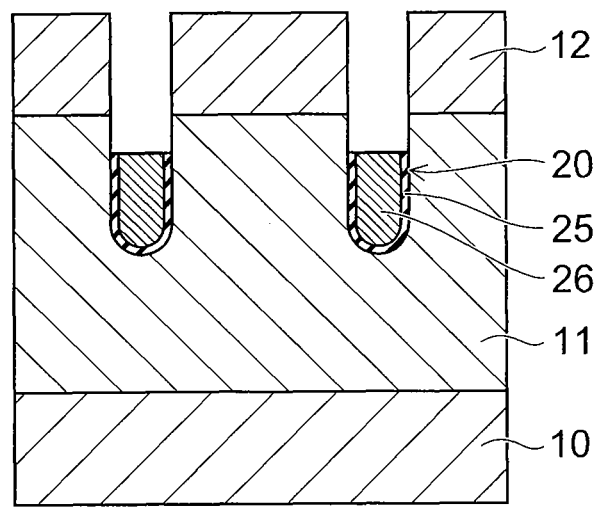

Next, as shown in FIG. 3B, etch back is performed on the field plate electrode 26. Thereby, the field plate electrode 26 is adjusted to have a predetermined height. In addition, the field plate insulating film 25 is removed at a portion above the field plate electrode 26 by the etch back.

Figure 4A:
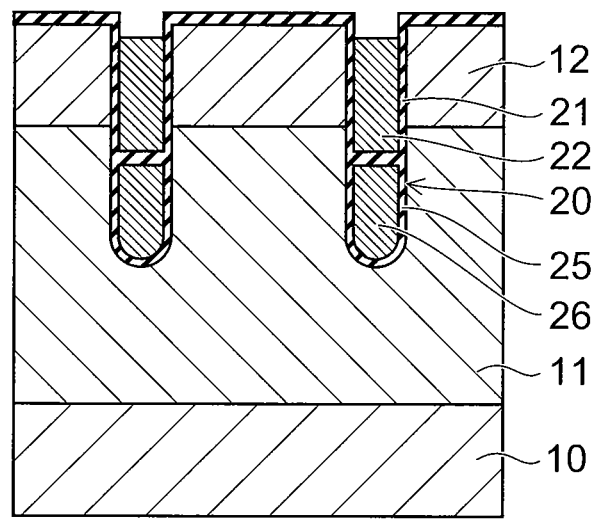

Next, as shown in FIG. 4A, in the trench 20, the gate insulating film 21 is formed on the field plate electrode 26 by thermal oxidation. Subsequently, in the trench 20, the gate electrode 22 is formed by CVD via the gate insulating film 21. Etch back is performed on the gate electrode 22 if needed, and thereby the gate electrode 22 is adjusted to have a predetermined height. After this, the extra gate insulating film 21 formed on the base layer 12 is removed.

Figure 4B:
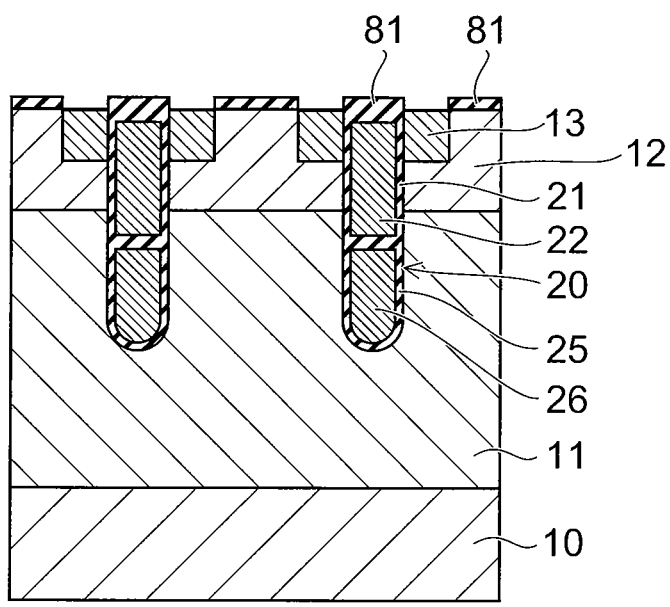

Next, as shown in FIG. 4B, a mask member 81 that covers the base layer 12 and the gate electrode 22 is formed. A part of the base layer 12 adjacent to the trench 20 is opened through the mask member 81. Subsequently, the n-type impurity is ion-injected on the surface of the base layer 12 opened through the mask member 81. Thereby, the source layer 13 is selectively formed on the surface of the base layer 12 so as to be in contact with the gate insulating film 21. In addition, if needed, the contact layer 15 may be selectively formed on the surface of the base layer 12 by ion implantation so as to be adjacent to the source layer 13. Subsequently, the mask member 81 on the gate electrode 22 is made to remain as an interlayer insulating film, and the extra mask member 81 other than on the gate electrode 22 is removed.

After this, as shown in FIG. 1B, formed are the source electrode 51 electrically connected to the source layer 13 and the field plate electrode 26, and the drain electrode 50 electrically connected to the drift layer 11. The semiconductor device 1 is formed by the above-described manufacturing processes.

An operational advantage of the semiconductor device 1 will be described illustrating a semiconductor device according to a reference example.

In the semiconductor device 1, for example, when a pitch of the trenches 20 is 1.5 μm, the device has a breakdown voltage not less than 35 V in a case where the n-type impurity concentration contained in the drift layer 11 is $1.0 \times 10^{16}$ (atoms/cm$^3$). When the pitch of the trenches 20 is made smaller than 1.5 μm, the breakdown voltage is maintained even though the n-type impurity concentration contained in the drift layer 11 is made further higher.

However, when the n-type impurity concentration contained in the drift layer 11 is set to be not less than $1.0 \times 10^{16}$ (atoms/cm$^3$), a mobility in the drift layer 11 begins to decrease although the breakdown voltage is maintained. As one of main causes of the decrease of mobility, it is considered that when the impurity concentration of the drift layer 11 becomes too high, carriers are not easily scattered due to the impurity.

Figure 5A:
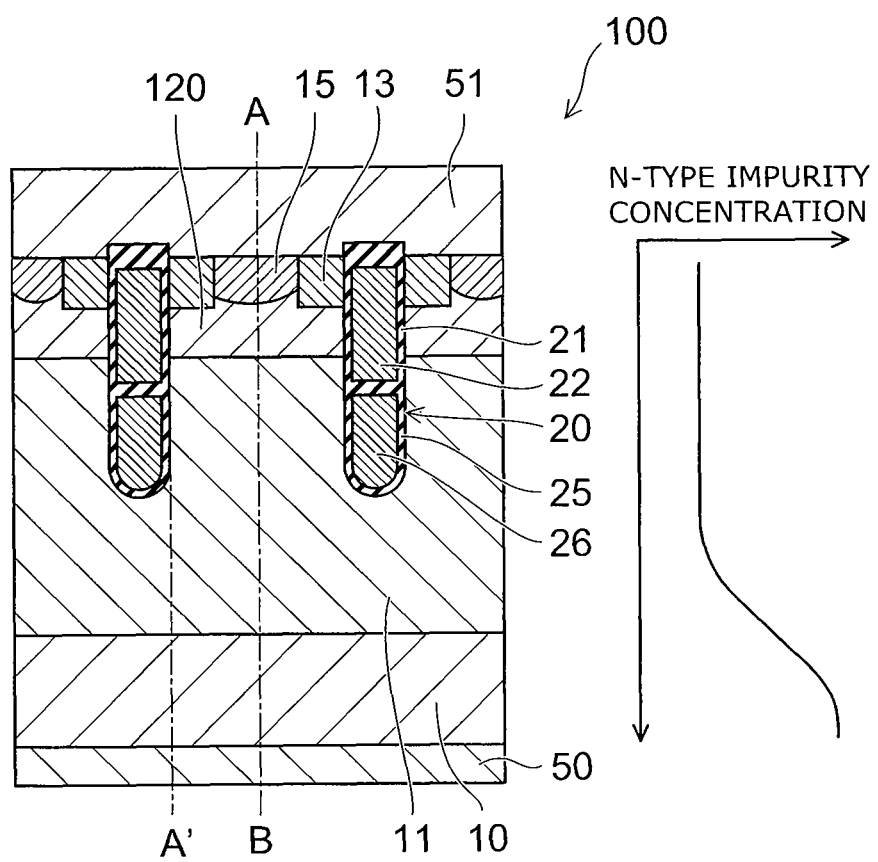
FIGS. 5A and 5B are schematic views of a semiconductor device according to a reference example.
Figure 5B:
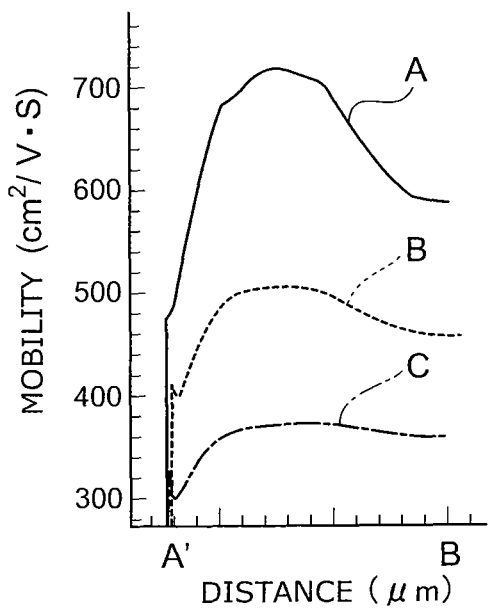

FIGS. 5A and 5B are schematic views of a semiconductor device according to a reference example, and FIG. 5A shows a cross-sectional schematic view and an impurity concentration profile, and FIG. 5B is a graph showing change of a mobility in a channel when an n-type impurity concentration contained in a base layer is changed.

The impurity concentration profile shown on a right side of the cross-sectional schematic view of the semiconductor device shows n-type impurity concentrations in the base layer 12, the drift layer 11, and the drain layer 10 along an A-B line of the cross-sectional schematic view.

A semiconductor device 100 according to the reference example is a MOSFET with a trench gate type structure. The semiconductor device 100 is an n-channel type MOSFET, and includes the field plate electrode 26. In the semiconductor device 100, the base layer 120 is formed by ion-implanting on a surface of the drift layer 11 with a uniform impurity concentration. The drift layer 11 is formed by epitaxial growth. Hence, as shown in FIG. 5A, an n-type impurity concentration contained in the base layer 120 is substantially the same as the n-type impurity concentration contained in the drift layer 11.

In the n-channel type MOSFET, generally, an on-resistance of the drift layer 11 is inversely proportional to a mobility and a carrier density. In addition, since a carrier density and an amount of n-type impurity are considered to be the same as each other in a high-concentration n-type semiconductor layer, such as the drain layer 10, an on-resistance tends to decrease when the impurity concentration is increased.

However, the carriers within the channel formed in the base layer 12 are minority carriers in an inversion layer. An amount of the minority carriers is determined by a thickness of the gate insulating film 21, a voltage applied to the gate electrode 22, etc. The amount of the minority carriers does not depend on the n-type impurity concentration contained in the base layer 12. Accordingly, in the channel formed in the base layer 12, there is a case where a density of the carriers does not change, and only a mobility decreases even though the n-type impurity concentration increases. Namely, when the n-type impurity concentration contained in the base layer 12 is too high, there is a possibility that not only the resistance of the drift layer 11 but also a resistance of the channel increase.

In FIG. 5B, change of the mobility in the channel is shown when the n-type impurity concentration contained in the base layer is changed. FIG. 5B was obtained by a simulation.

A distance (μm) in a lateral direction in the base layer 120 is shown in a horizontal axis of FIG. 5B. The distance (μm) in the lateral direction is a distance from a boundary A' between the trench 20 and the drift layer 11 to a position B. A vertical axis of FIG. 5B shows the mobility (cm$^2$/V·s).

A line A is an example where the n-type impurity concentration is $1.0 \times 10^{16}$ (atoms/cm$^3$). A line B is an example where the n-type impurity concentration is $8.0 \times 10^{16}$ (atoms/cm$^3$). A line C is an example where the n-type impurity concentration is $2.0 \times 10^{17}$ (atoms/cm$^3$). An impurity concentration contained in the base layer 120 in the each line is set so that a threshold voltage value is the same as each other.

From FIG. 5B, it can be seen that the mobility of the channel formed in the base layer 120 becomes lower as the n-type impurity concentration becomes higher. Namely, when the n-type impurity concentration contained in the base layer 120 is too high, the mobility of the channel becomes low.

Figure 6:
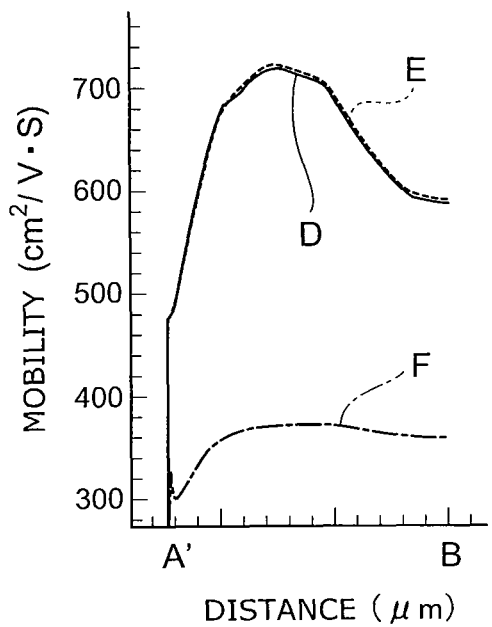
FIG. 6 is a graph showing change of a mobility in the channel when the n-type impurity concentration contained in the base layer in the first embodiment is changed.

In contrast with this, FIG. 6 is a graph showing change of a mobility in the channel when the n-type impurity concentration contained in the base layer in the first embodiment is changed. FIG. 6 was obtained by a simulation.

A horizontal axis of FIG. 6 shows a distance (μm) in a lateral direction of the base layer 12. The distance (μm) in the lateral direction is a distance from the boundary A' between the trench 20 and the drift layer 11 to the position B in the base layer 12. A vertical axis of FIG. 6B shows the mobility (cm$^2$/V·s).

A line D in FIG. 6 is an example where the n-type impurity concentration contained in the drift layer 11 is $2.0 \times 10^{17}$ (atoms/cm$^3$), and where the n-type impurity concentration contained in the base layer 12 is $1.0 \times 10^{16}$ (atoms/cm$^3$). A line E is an example where the both n-type impurity concentrations contained in the drift layer 11 and the base layer 12 are respectively $1.0 \times 10^{16}$ (atoms/cm$^3$). A line F is an example where the both n-type impurity concentrations contained in the drift layer 11 and the base layer 12 are respectively $2.0 \times 10^{17}$ (atoms/cm$^3$).

It can be seen that the line D and the line E are substantially overlapped with each other. This is because the n-type impurity concentration contained in the base layer 12 is the same in the line D and in the line E. However, when the n-type impurity concentration contained in the base layer 12 is increased as in the case of the line F, the mobility of the channel decreases.

Meanwhile, even when the n-type impurity concentration contained in the base layer 12 is the same in the line D and in the line E, a resistance of the drift layer 11 decreases in the line D in which the n-type impurity concentration contained in the drift layer 11 is increased as compared with the line E. In other words, even though the n-type impurity concentration contained in the drift layer 11 is increased as in the case of the line D, if the n-type impurity concentration contained in the base layer 12 is set to be lower than the n-type impurity concentration contained in the drift layer 11, the mobility becomes the same as in the case of the line E in which the both impurity concentrations in the drift layer 11 and in the base layer 12 are low.

In the embodiment, in a case where the n-type impurity concentration contained in the drift layer 11 is not less than $1.0 \times 10^{16}$ (atoms/cm$^3$), the n-type impurity concentration contained in the base layer 12 is set to be lower than the n-type impurity concentration contained in the drift layer 11. As a result of this, the mobility of the channel does not decrease, and increase of the channel resistance can be suppressed.

When the n-type impurity concentration contained in the drift layer 11 becomes smaller than $1.0 \times 10^{16}$ (atoms/cm$^3$), there is a case where the on-resistance of the drift layer 11 decreases. Accordingly, it is preferable that the n-type impurity concentration contained in the drift layer 11 be not less than $1.0 \times 10^{16}$ (atoms/cm$^3$).

Figure 7:
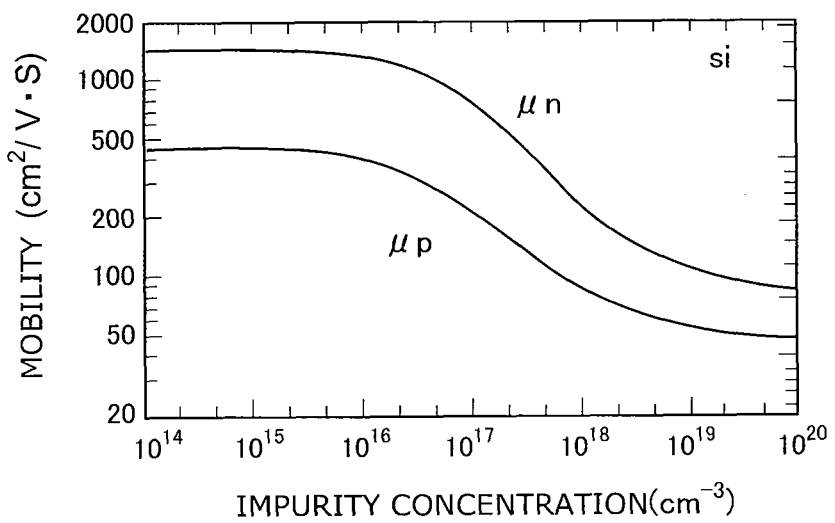
FIG. 7 is a graph for explaining a relation between an impurity concentration contained in a silicon crystal layer and a mobility.

FIG. 7 is a graph for explaining a relation between an impurity concentration contained in a silicon crystal layer and a mobility. In FIG. 7, shown is one example of the relation between the impurity concentration contained in the silicon crystal layer and the mobility (Refer to E. F. Labuda and J. T. Clemens, "Integrated Ciruit Technology", in R. E. Kirk and D. F. Othmer, Eds., Encyclopedia of Chemical Technology, Wiley, N.Y., 1980).

A horizontal axis of FIG. 7 shows the impurity concentration (atoms/cm$^3$), and a right vertical axis shows the mobility (cm$^2$/V·s). $\mu_n$ is a relation between an n-type impurity concentration and the mobility, and $\mu_p$ is a relation between a p-type impurity concentration and the mobility. As can be seen from FIG. 7, the mobility is substantially constant in a range where the impurity concentration is smaller than $1.0 \times 10^{16}$ (atoms/cm$^3$). The mobility begins to decrease gradually in a range where the impurity concentration is $1.0 \times 10^{16}$ (atoms/cm$^3$) to $1.0 \times 10^{19}$ (atoms/cm$^3$). When the impurity concentration becomes larger than $1.0 \times 10^{19}$ (atoms/cm$^3$), decrease in the mobility is saturated.

Accordingly, in the embodiment, the n-type impurity concentration contained in the drift layer 11 may be set to be in a range not less than $1.0 \times 10^{16}$ (atoms/cm$^3$) and not more than $1.0 \times 10^{19}$ (atoms/cm$^3$). The n-type impurity concentration contained in the base layer 12 may be set lower than the n-type impurity concentration contained in the drift layer 11 in the range not less than $1.0 \times 10^{16}$ (atoms/cm$^3$) and not more than $1.0 \times 10^{19}$ (atoms/cm$^3$).

Second Embodiment

Figure 8:
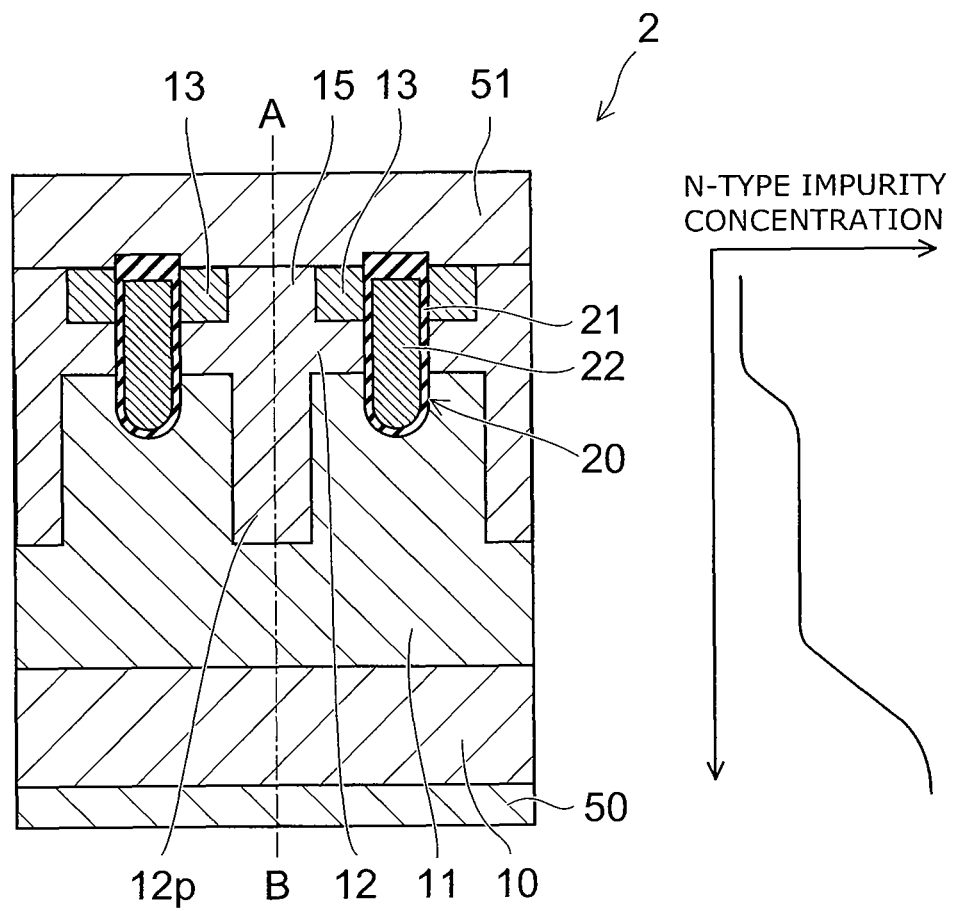
FIG. 8 is a cross-sectional schematic view of a semiconductor device according to a second embodiment, and an impurity concentration profile.

FIG. 8 is a cross-sectional schematic view of a semiconductor device according to a second embodiment, and an impurity concentration profile.

The impurity concentration profile shown on a right side of the cross-sectional schematic view of the semiconductor device shows n-type impurity concentrations in a base layer, a drift layer, and a drain layer along an A-B line of the cross-sectional schematic view.

A semiconductor device 2 according to the second embodiment is a MOSFET with a trench gate type structure. As the MOSFET, an n-channel type MOSFET is illustrated as one example. The semiconductor device 2 includes a super junction structure.

The semiconductor device 2 has the drain layer 10, and the drift layer 11 is provided on the drain layer 10. The base layer 12 is provided on the drift layer 11. The source layer 13 is selectively provided on the surface of the base layer 12.

The n-type impurity concentration contained in the base layer 12 is lower than the n-type impurity concentration contained in the drift layer 11. The n-type impurity concentration contained in the drift layer 11 is not less than $1 \times 10^{16}$ (atoms/cm$^3$).

In the semiconductor device 2, the gate electrode 22 is provided via the gate insulating film 21 in the trench 20 that penetrates the source layer 13 and the base layer 12 to reach the drift layer 11.

In the semiconductor device 2, a p-type semiconductor layer 12p is provided from the surface of the drift layer 11 to an inside thereof. A top end of the semiconductor layer 12p is connected to the base layer 12. The semiconductor layer 12p is pillar-shaped. Since the semiconductor layer 12p is pillar-shaped, the drift layer 11 adjacent to the semiconductor layer 12p is pillar-shaped. The semiconductor device 2 includes a super junction structure in which the pillar-shaped drift layer 11 and the pillar-shaped semiconductor layer 12p are alternately periodically arranged on the drain layer 10.

In the semiconductor device 2, the p-type contact layer 15 is selectively provided on the surface of the base layer 12 so as to be adjacent to the source layer 13. The contact layer 15 is located above the semiconductor layer 12p. The p-type impurity concentration contained in the contact layer 15 is higher than a value obtained by subtracting the n-type impurity concentration contained in the base layer 12 from the p-type impurity concentration contained in the base layer 12.

The drain electrode 50 is connected to the drain layer 10. The drain electrode 50 is electrically connected to the drift layer 11. The source electrode 51 is electrically connected to the source layer 13 and the contact layer 15.

In the semiconductor device 2, since the super junction structure is provided, a depletion layer can be extended in a direction substantially parallel to the major surface of the drain layer 10 from an interface between the p-type semiconductor layer 12p and the n-type drift layer 11. As a result of this, the depletion layer formed in the drift layer 11 easily extends. Consequently, the semiconductor device 2 has a high breakdown voltage.

In the semiconductor device 2, since the depletion layer formed in the drift layer 11 easily extends, the n-type impurity concentration contained in the drift layer 11 can be set to be high. For example, in the semiconductor device 2, even if the n-type impurity concentration contained in the drift layer 11 is set to be not less than $1.0 \times 10^{16}$ (atoms/cm$^3$), it is possible to deplete the whole drift layer 11. Since the drift layer 11 has a high concentration, a resistance of the drift layer 11 decreases.

As described above, in the semiconductor device 2, similarly to the semiconductor device 1, in a case where the n-type impurity concentration contained in the drift layer 11 is not less than $1.0 \times 10^{16}$ (atoms/cm$^3$), the n-type impurity concentration contained in the base layer 12 is set to be lower than the n-type impurity concentration contained in the drift layer 11. As a result of this, the mobility of the channel does not decrease, and increase of the channel resistance can be suppressed.

In the embodiment, although the case has been described where the first conductivity type is the n type, and the second conductivity type is the p-type, a case can also be implemented where the first conductivity type is the p-type, and the second conductivity type is the n-type.

In addition, in the embodiment, a formation process of the super junction structure can be implemented even when any process is used, such as a process of repeating ion implantation and buried crystal growth, and a process of changing an acceleration voltage.

Hereinabove, exemplary embodiments of the invention are described with reference to specific examples. However, the invention is not limited to these specific examples. Namely, an example made by appropriately changing the designs of these specific examples by one skilled in the art is also included in the scope of the embodiment as long as the example has a feature of the embodiment. Each component included in the above-mentioned each specific example, and arrangement, materials, conditions, shapes, sizes, etc. of the component are not limited to the illustrated ones, and they can be changed appropriately.

In addition, each component included in the above-mentioned each embodiment can be combined with each other as long as technically feasible, and combinations of the each component are also included in the scope of the embodiment as long as they include the feature of the embodiment. Moreover, since one skilled in the art can consider various types of changed examples and modified examples in the category of the embodiment idea, it is understood that the changed examples and modified examples also belong to the scope of the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising: a drift layer of a first conductivity type;
    a base layer of a second conductivity type provided on the drift layer;
    a source layer of the first conductivity type selectively provided on a surface of the base layer;
    a gate electrode contacting the source layer, the base layer, and the drift layer via a gate insulating;
    a semiconductor layer of the second conductivity type connected to the base layer and extending into the drift layer;
    a drain electrode electrically connected to the drift layer; and
    a source electrode electrically connected to the source layer, wherein:
    an impurity concentration of the first conductivity type contained in the base layer is lower than an impurity concentration of the first conductivity type contained in the drift layer;
    the impurity concentration of the first conductivity type contained in the base layer is lower than an impurity concentration of the first conductivity type contained in the semiconductor layer; and
    the impurity concentration of the first conductivity type contained in the drift layer is not less than $1\times10^{16}$ (atoms/cm$^3$),
    an impurity concentration profile through the drift layer and the semiconductor layer along a first direction from the drain electrode toward the source electrode has a first portion in which impurity concentration of the first conductivity type is constant and not less than $1\times10^{16}$ (atoms/cm$^3$) and a second portion in which impurity concentration of the first conductivity type is decreasing along the first direction from the drain electrode toward the source electrode and less than $1\times10^{16}$ (atoms/cm$^3$),
    the first portion is between the second portion and the drain electrode along the first direction, and
    the first portion extends for a first distance along the first direction and the second portion extends for a second distance along the first direction that is less than the first distance.

2. The device according to claim 1, wherein:
    a contact layer of the second conductivity type is selectively provided on the surface of the base layer so as to be adjacent to the source layer;
    an impurity concentration of the second conductivity type contained in the contact layer is higher than a value obtained by subtracting the impurity concentration of the first conductivity type contained in the base layer from an impurity concentration of the second conductivity type contained in the base layer; and
    the contact layer is connected to the source electrode.

3. The device according to claim 1, wherein the drift layer and the semiconductor layer are arranged alternately to form a super junction structure.

4. The device according to claim 1, wherein the first conductivity type is n type and the second conductivity type is p type, or the first conductivity type is p type and the second conductivity type is n type.

5. The device according to claim 2, wherein the contact layer is aligned with the semiconductor layer along a direction orthogonal to a layer plane of the base layer.

6. The device according to claim 1, wherein the gate electrode has a trench gate type structure.

* * * * *